(12) United States Patent
Amemiya et al.

(10) Patent No.: US 7,679,385 B2
(45) Date of Patent: Mar. 16, 2010

(54) PROBE CARD FOR INSPECTING ELECTRIC PROPERTIES OF AN OBJECT

(75) Inventors: Takashi Amemiya, Yamanashi (JP); Syuichi Tsukada, Yamanashi (JP)

(73) Assignees: Tokyo Electron Limited (JP); JSR Corporation (JP)

( * ) Notice: Subject to any disclaimer, the term of this patent is extended or adjusted under 35 U.S.C. 154(b) by 0 days.

(21) Appl. No.: 11/822,577

(22) Filed: Jul. 9, 2007

(65) Prior Publication Data
US 2008/0007280 A1     Jan. 10, 2008

(30) Foreign Application Priority Data

Jul. 10, 2006    (JP)    ............... 2006-189723
Jul. 4, 2007    (JP)    ............... 2007-176048

(51) Int. Cl.
     *G01R 31/02*     (2006.01)
(52) U.S. Cl. ............................ 324/754
(58) Field of Classification Search ............. 324/754
See application file for complete search history.

(56) References Cited

U.S. PATENT DOCUMENTS

| | | | |
|---|---|---|---|
| 5,109,596 A | 5/1992 | Driller et al. | |
| 6,228,687 B1 * | 5/2001 | Akram et al. | 438/125 |
| 7,059,874 B2 * | 6/2006 | Weiss | 439/91 |
| 7,349,223 B2 * | 3/2008 | Haemer et al. | 361/767 |
| 2006/0119377 A1 * | 6/2006 | Chong et al. | 324/764 |
| 2006/0154497 A1 | 7/2006 | Amemiya et al. | |
| 2007/0268032 A1 * | 11/2007 | Yoshioka et al. | 324/754 |

FOREIGN PATENT DOCUMENTS

| | | |
|---|---|---|
| EP | 1 607 751 A1 | 12/2005 |
| JP | 3038859 | 8/1991 |
| JP | EP1768214 A1 * | 3/2007 |
| WO | WO 2006/008784 A1 | 1/2006 |

OTHER PUBLICATIONS

European Search Report, Oct. 11, 2007.

* cited by examiner

*Primary Examiner*—Ha Tran T Nguyen
*Assistant Examiner*—Shaun Campbell
(74) *Attorney, Agent, or Firm*—Finnegan, Henderson, Farabow, Garrett & Dunner, LLP

(57) ABSTRACT

In the present invention, an inspection contact structure is attached to a lower surface side of a circuit board of a probe card. The inspection contact structure has a silicon substrate, and sheets attached to upper and lower surfaces of the silicon substrate. Each of the sheets is elastic and has conductive portions in a projecting shape. The silicon substrate is formed with current-carrying paths passing through the substrate in a vertical direction so that the conductive portions of the sheets and the current-carrying paths of the silicon substrate are in contact with each other. The upper and lower sheets are fixed to the silicon substrate, and the sheet on the upper surface is fixed to a circuit board.

20 Claims, 7 Drawing Sheets

PROBE CARD FOR INSPECTING ELECTRIC PROPERTIES OF AN OBJECT

BACKGROUND OF THE INVENTION

1. Field of the Invention

The present invention relates to a probe card to contact with an object to be inspected to inspect electric properties of the object to be inspected.

2. Description of the Related Art

Inspection of electric properties of an electronic circuit such as an IC, LSI, or the like formed, for example, on a semiconductor wafer is performed by bringing, for example, a plurality of probe needles arranged on the lower surface of a probe card into electrical contact with electrode pads of the electronic circuit on the wafer. Therefore, the probe needles need to be arranged in alignment with the positions of the respective electrode pads.

However, the pattern of the electronic circuit has become finer in which the electrode pads have been made finer and intervals between the electrode pads have become smaller. This requires formation of fine contact portions at a narrow pitch, such as those with a width dimension of 100 μm or less and at a pitch of 180 μm or less. Hence, use of an anisotropic conductive sheet instead of the probe needles is proposed (Japanese Patent No. 3038859). The anisotropic conductive sheet is a sheet having a plurality of elastic conductive portions protruding from one surface of the sheet being an insulating portion, in which the conductive portions can be formed very fine at a narrow pitch.

SUMMARY OF THE INVENTION

However, when the above-described anisotropic conductive sheet is simply used, the conductive portions have limitations in dimension in the height direction because the conductive portions are formed fine at a narrow pitch, resulting in small displacement in the height direction presented by the elasticity of the conductive portions. As a result, the conductive portions cannot absorb, by their elasticity, variations in height of a number of electrode pads on the wafer surface, thus causing unstable contact between the conductive portions and the electrode pads within the wafer surface. Further, the inclination and distortion on the probe card side occurring due to attachment or thermal expansion of the probe card cannot be sufficiently absorbed by the elasticity of the conductive portions, resulting in unstable contact of the electrode pads within the wafer surface.

The present invention has been developed in consideration of the above points and its object is to provide a probe card in which contact portions to an object to be inspected such as a wafer are made very fine at a narrow pitch, and contact with the object to be inspected are stably performed.

To achieve the above object, the present invention is a probe card for inspecting electric properties of an object to be inspected located thereunder, including: a circuit board; and an inspection contact structure provided between the circuit board and the object to be inspected, for passing current between the object to be inspected and the circuit board, the inspection contact structure including: a substrate in a flat plate shape; and sheets attached to both upper and lower surfaces of the substrate to have the substrate sandwiched therebetween, each of the sheets composed of a plurality of elastic conductive portions and an insulating portion interconnecting the conductive portions, the conductive portions being formed to pass through each sheet and protrude from both upper and lower surfaces of each sheet, the substrate being formed with a plurality of current-carrying paths passing from the upper surface to the lower surface, the conductive portions of the sheets on both surfaces of the substrate being electrically connected to corresponding current-carrying paths of the substrate, the sheets on both surfaces of the substrate being fixed to the substrate, and the sheet on the upper surface side of the substrate being fixed to the circuit board.

According to the present invention, sheets each having many conductive portions formed within the sheet are used, so that very fine contact portions at a narrow pitch can be realized. Since the sheets are attached to both upper and lower surfaces of the substrate, the conductive portions of the sheet on the lower surface side come into contact with the electrodes of the object to be inspected so that the elasticity of the conductive portions can absorb, for example, the variations in height of the object to be inspected. Further, the conductive portions of the sheet on the upper surface side come into contact with connecting terminals of the circuit board so that the elasticity of the conductive portions can absorb the distortion and inclination of the whole probe card or the circuit board. In particular, the sheet on the upper surface side is fixed to the circuit board and therefore can easily follow the shape of the circuit board to absorb the distortion and inclination of the circuit board with more reliability. Accordingly, the electrical contact between the probe card and the object to be inspected becomes stable to enable appropriate inspection of the electrical properties.

The current-carrying paths of the probe card may pass through the substrate in a vertical thickness direction, and the conductive portions of the sheets on both surfaces of the substrate may be in contact with end portions of the respective corresponding current-carrying paths of the substrate in a manner to have the current-carrying paths of the substrate sandwiched therebetween.

The conductive portions of the sheet on the upper surface side of the probe card may be formed to have weaker elasticity than that of the conductive portions of the sheet on the lower surface side.

The sheet on the upper surface side of the probe card may have a frame attached thereto, the frame surrounding an outer peripheral portion of the sheet and holding the sheet, and the sheet on the upper surface side may be fixed to the circuit board by the frame; and the frame may be fixed to the circuit board at a position outside the substrate.

Further, the frame may have a plurality of flexible plate shape members extending to the outside of the substrate, and outer end portions of the plate shape members may be fixed to the circuit board.

A notch may be formed in a side surface in a width direction perpendicular to an outward direction of the plate shape member.

A hole may be formed at an outer end portion of the plate shape member, and the frame may be fixed to the circuit board with an adhesive partially entering the hole.

Further, the frame may be fixed to the circuit board with an elastic adhesive.

The frame may be made of a material having a same thermal expansion coefficient as that of the object to be inspected. It should be note that "a material having a same thermal expansion coefficient as that of the object to be inspected" includes not only one having the exactly same thermal expansion coefficient as that of the object to be inspected, but also one having substantially the same thermal expansion coefficient, for example, in a range of the thermal expansion coefficient of the object to be inspected ±4 ppm/K.

The sheet on the upper surface side of the probe card may be fixed to the substrate by the frame.

The sheet on the lower surface side may have another frame attached thereto, the frame surrounding an outer peripheral portion of the sheet and holding the sheet, and the sheet on the lower surface side may be fixed to the substrate by the other frame.

The other frame may be fixed to the substrate with an elastic adhesive.

The other frame may be made of a material having a same thermal expansion coefficient as that of the object to be inspected.

The substrate may be made of a material having a same thermal expansion coefficient as that of the object to be inspected. Further, the substrate may be a silicon substrate.

The conductive portions of the sheets on both surfaces of the substrate and the current-carrying paths of the substrate may be arranged on same axes in a vertical direction.

A metal wiring connecting predetermined current-carrying paths may be formed on at least any of the upper surface and the lower surface of the substrate.

Tapered contactors that come into contact with the object to be inspected may be attached to tip portions of the conductive portions of the sheet on the lower surface side, and the contactors may be held on a holder and fixed to the substrate by the holder.

The conductive portions of the sheets may be brought into a state capable of making electrical continuity when compressed in the vertical direction, and the sheet on the upper surface side may be fixed to the substrate and the circuit board and the sheet on the lower surface side may be fixed to the substrate with the conductive portions being in a state incapable of making electrical continuity without being compressed.

According to the present invention, the inspection of electric properties of an object to be inspected is stably performed so that defects of electronic devices can be surely detected to improve the quality of the electronic devices.

DETAILED DESCRIPTION OF THE INVENTION

Figure 1:
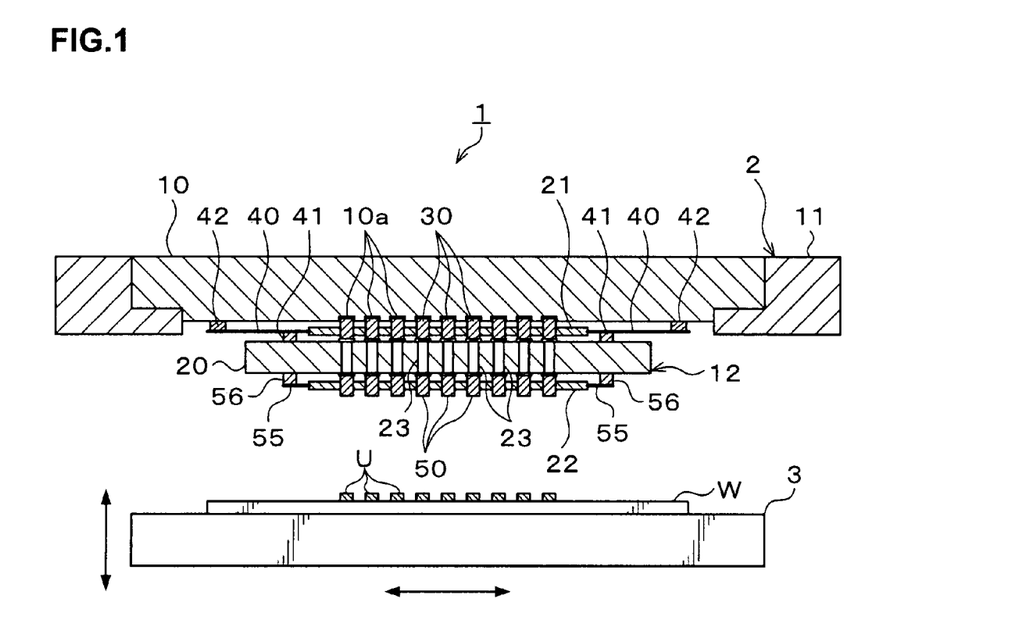
FIG. 1 is an explanatory view of a longitudinal section showing a schematic configuration of a probe device.

Hereinafter, a preferred embodiment of the present invention will be described. FIG. 1 is a longitudinal sectional view showing a schematic configuration of a probe device 1 having a probe card according to this embodiment.

In the probe device 1, for example, a probe card 2 and a mounting table 3 on which a wafer W as an object to be inspected is mounted are provided. The probe card 2 is disposed above the mounting table 3. The probe card 2 includes a circuit board 10 for transmitting an electrical signal for inspection, for example, to the wafer W mounted on the mounting table 3; a holder 11 for holding the outer peripheral portion of the circuit board 10; and an inspection contact structure 12 which is attached to the circuit board 10 on a lower surface side and comes into contact with electrode pads U on the wafer W to pass current between the circuit board 10 and the wafer W.

The circuit board 10 is formed, for example, in a substantially disk shape. On the lower surface of the circuit board 10, a plurality of connecting terminals 10a are formed.

Figure 2:
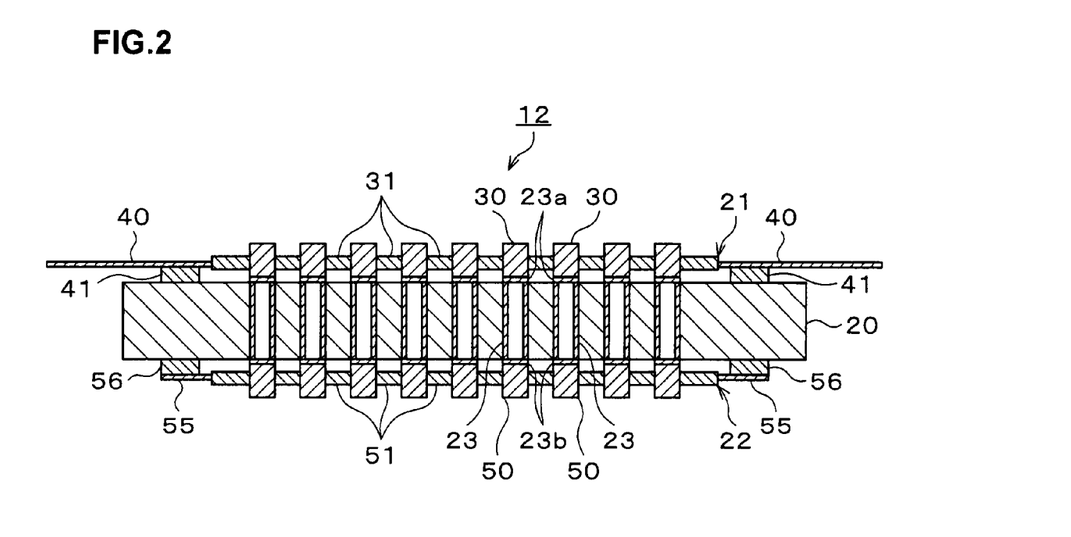
FIG. 2 is an explanatory view of a longitudinal section showing a configuration of an inspection contact structure.

The inspection contact structure 12 includes a silicon substrate 20, for example, as a substrate in a shape of a flat plate; a first sheet 21 attached to an upper surface of the silicon substrate 20; and a second sheet 22 attached to the lower surface of the silicon substrate 20.

The silicon substrate 20 is formed in a shape of a square flat plate that is thin, for example, about 200 μm to about 400 μm. The silicon substrate 20 has the same thermal expansion coefficient as that of the wafer W. The silicon substrate 20 is formed with a plurality of current-carrying paths 23 which vertically pass through the silicon substrate 20 from its upper surface to its lower surface as shown in FIG. 2. The current-carrying paths 23 are formed such that they correspond one-to-one with the plurality of electrode pads U on the wafer W. Upper connecting terminals 23a are formed at the top end portions of the current-carrying paths 23, while lower connecting terminals 23b are formed at the bottom end portions of the current-carrying paths 23. Note that processing and wiring of the silicon substrate 20 are performed by the etching technique and the photolithography technique.

Figure 3:
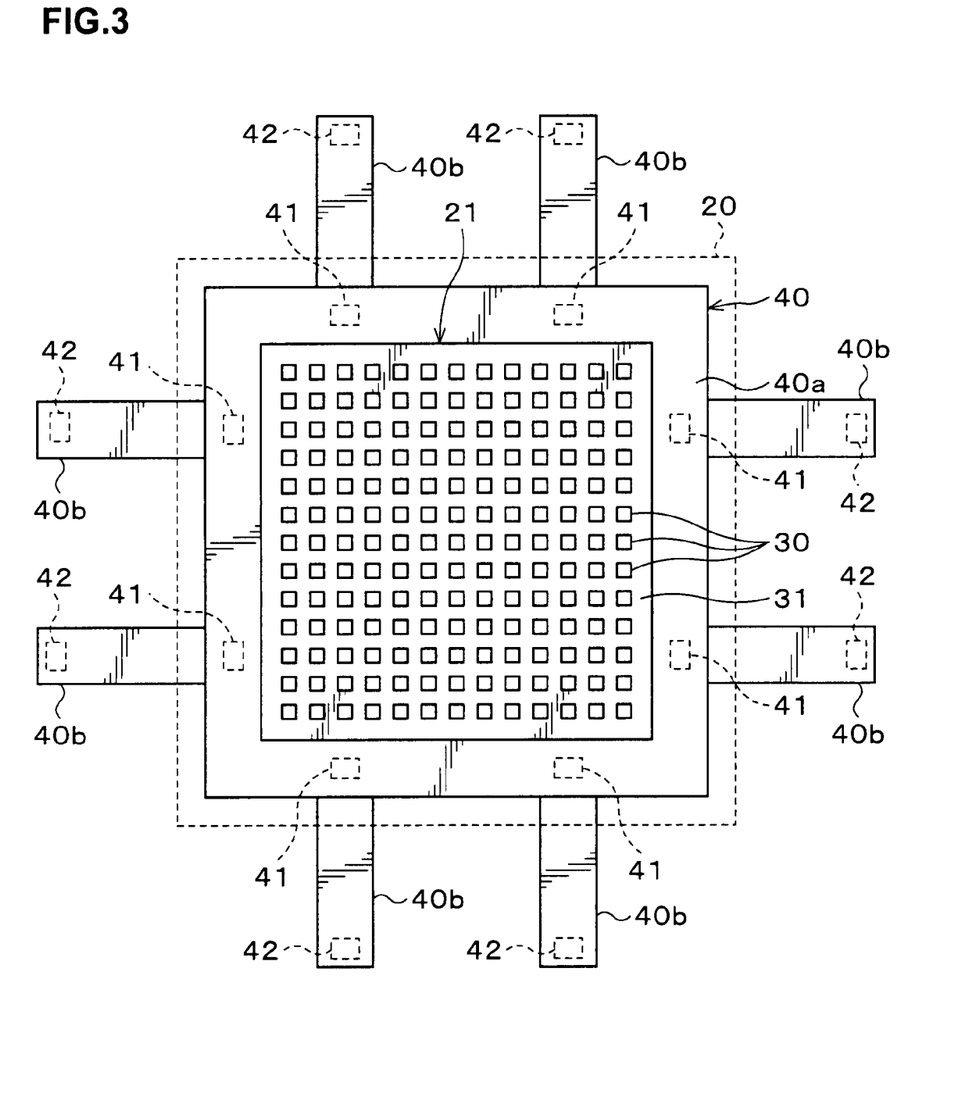
FIG. 3 is a plan view of a first sheet.
Figure 4:
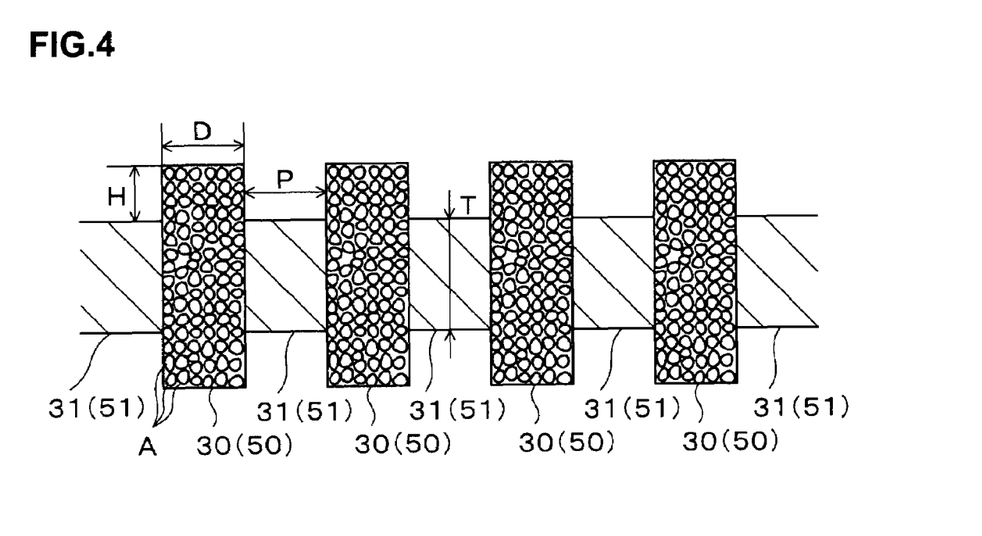
FIG. 4 is an explanatory view of a structure of the sheet.

The first sheet 21 is an elastic rubber sheet having, for example, a square shape as a whole as shown in FIG. 3, and is composed of a plurality of conductive portions 30 densely arranged within the sheet surface and an insulating portion 31 interconnecting the conductive portions 30. The plurality of conductive portions 30 are formed to correspond one-to-one with the current-carrying paths 23 of the silicon substrate 20 as shown in FIG. 2. The insulating portion 31 is formed of, for example, a polymeric substance having insulation performance and elasticity. In each of the conductive portions 30, for example, conductive particles A are densely filled in a polymeric substance having insulation performance and elasticity as shown in FIG. 4. The conductive portion 30 is brought into a state incapable of making electrical continuity in its uncompressed state in which the conductive particles A are not in contact with one another, and the conductive portion 30 is brought into a state capable of making electrical continuity in its compressed state in which the conductive particles A are brought into contact with one another. Each of the conductive portions 30 is formed in a shape of a square pole vertically passing through the first sheet 21 and protruding from both the upper and lower surfaces of the first sheet 21. According to the above configuration, the conductive portions 30 have conductivity in the compressed state and have elasticity in the vertical direction. For example, the thickness T of the insulating portion 31 of the first sheet 21 is set to, for example, about 100 µm, and the conductive portion 30 is formed such that its height H from the sheet surface is about 30 µm that is 0.3 times the thickness of the insulating portion 31. The conductive portion 30 is formed such that its width D is, for example, about 85 µm, and the pitch P between adjacent conductive portions 30 is set to about 180 µm.

As shown in FIG. 3, the first sheet 21 is fixed to, for example, a metal frame 40 as a frame surrounding its outer peripheral portion. The metal frame 40 is made of, for example, an iron-nickel alloy (Fe—Ni alloy) having the same thermal expansion coefficient as that of the wafer W. The metal frame 40 has a frame shape portion 40a in square shape along the outer peripheral portion of the first sheet 21 and a plurality of plate shape portions 40b as plate members extending outward from the frame shape portion 40a.

The frame shape portion 40a of the metal frame 40 is bonded to the upper surface of the outer peripheral portion of the silicon substrate 20, for example, with an elastic adhesive 41 as shown in FIG. 2. In this case, the conductive portions 30 of the first sheet 21 and the upper connecting terminals 23a of the current-carrying paths 23 of the silicon substrate 20 are arranged and connected on the same axes in the vertical direction. Used as the adhesive 41 is, for example, one made of silicone. The adhesive 41 is applied to a plurality of locations at regular intervals along the peripheral direction of the frame shape portion 40a, for example, as shown in FIG. 3.

The plate shape portion 40b of the metal frame 40 is formed in an elongated rectangular shape outward as shown in FIG. 3 and has flexibility. The plate shape portions 40b are attached, for example, to the outer peripheral surface of the frame shape portion 40a at regular intervals. The plate shape portions 40b extend to the outside of the silicon substrate 20 in the horizontal direction. As shown in FIG. 1, the outer end portion of each of the plate shape portions 40b is bonded to the lower surface of the circuit board 10, for example, with an elastic adhesive 42. In this case, the conductive portions 30 of the first sheet 21 and the connecting terminals 10a of the circuit board 10 are arranged and connected on the same axes in the vertical direction. Used as the adhesive 42 is, for example, one made of silicone. The adhesive 42 of the metal frame 40 fixes the whole inspection contact structure 12 to the circuit board 10.

The first sheet 21 is fixed between the silicon substrate 20 and the circuit board 10 with the conductive portions 30 being in the state incapable of making electrical continuity without being compressed in the vertical direction. In other words, the first sheet 21 is fixed to the circuit board 10 and the silicon substrate 20 while sufficiently keeping a space between the first sheet 21 and the circuit board 10 and a space between the first sheet 21 and the silicon substrate 20 to prevent the conductive portions 30 from being compressed by the fixation of the adhesive 41 and the adhesive 42.

Figure 5:
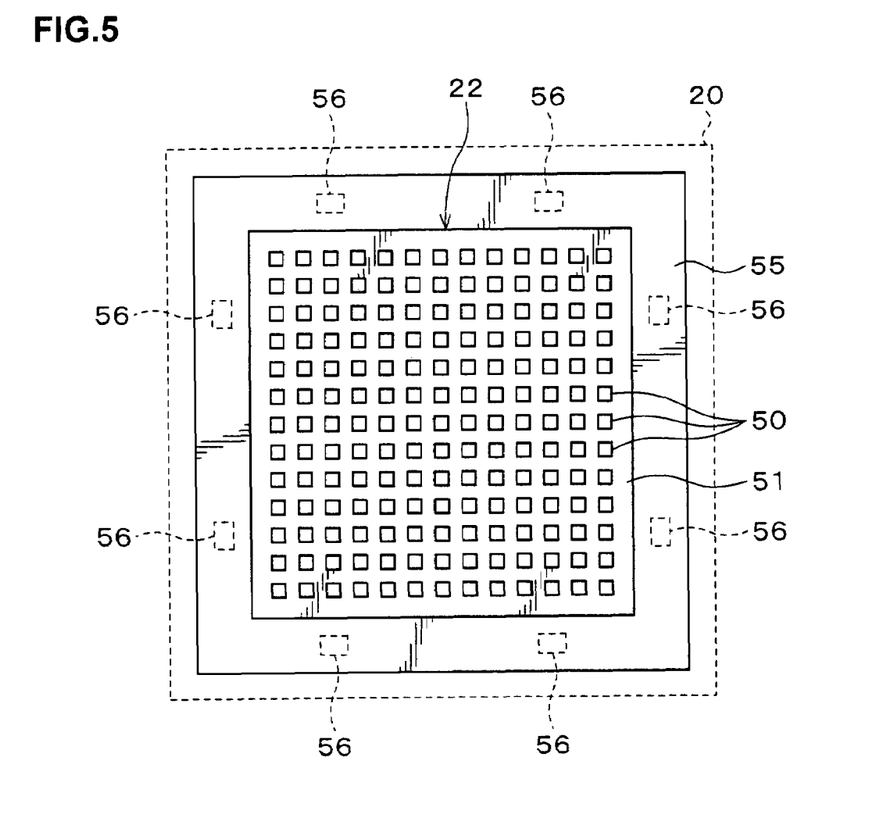
FIG. 5 is a plan view of a second sheet.

The second sheet 22, which has the same configuration as that of the first sheet 21, is a sheet made of rubber in a square shape as a whole as shown in FIG. 5, and composed of a plurality of conductive portions 50 and an insulating portion 51 interconnecting the conductive portions 50. The plurality of conductive portions 50 are formed to correspond one-to-one with the current-carrying paths 23 of the silicon substrate 20 as shown in FIG. 2. The insulating portion 51 is formed of, for example, a polymeric substance having insulation performance and elasticity. In each of the conductive portions 50, for example, conductive particles A are densely filled in a polymeric substance having insulation performance and elasticity as shown in FIG. 4, and the conductive portion 50 is brought into a state incapable of making electrical continuity in an uncompressed state in which the conductive particles A are not in contact with one another, and the conductive portion 50 is brought into a state capable of making electrical continuity in a compressed state in which the conductive particles A are brought into contact with one another. Each of the conductive portions 50 is formed in a shape of a square pole vertically passing through the second sheet 22 and protruding from both the upper and lower surfaces of the second sheet 22. According to the above configuration, the conductive portions 50 have conductivity in the compressed state and have elasticity in the vertical direction. For example, the second sheet 22 has the same dimensions as those of the first sheet 21, so that the thickness T of the insulating portion 51 is set, for example, to about 100 µm, the height H of the conductive portion 50 from the sheet surface is formed about 30 µm, the width D of the conductive portion 50 is, for example, about 85 µm, and the pitch P between adjacent conductive portions 50 is set to about 180 µm.

As shown in FIG. 5, the second sheet 22 is fixed to, for example, a metal frame 55 as another frame surrounding its outer peripheral portion. The metal frame 55 is made of, for example, an iron-nickel alloy (Fe—Ni alloy) having the same thermal expansion coefficient as that of the wafer W. The metal frame 55 has a square frame shape along the outer peripheral portion of the second sheet 22.

The metal frame 55 is bonded to the lower surface of the outer peripheral portion of the silicon substrate 20, for example, with an elastic adhesive 56 as shown in FIG. 2. In this case, the conductive portions 50 of the second sheet 22 and the lower connecting terminals 23b of the current-carrying paths 23 of the silicon substrate 20 are arranged and connected on the same axes in the vertical direction. Used as the adhesive 56 is, for example, one made of silicone. The adhesive 56 is applied to a plurality of locations at regular intervals along the peripheral direction of the metal frame 55, for example, as shown in FIG. 5.

The second sheet 22 is fixed to the silicon substrate 20 with the adhesive 56 to bring the conductive portions 50 into the state incapable of making electrical continuity without being compressed in the vertical direction. In other words, the second sheet 22 is fixed to the silicon substrate 20 while sufficiently keeping a space between the second sheet 22 and the silicon substrate 20 to prevent the conductive portions 50 from being compressed by the fixation of the adhesive 56.

Further, the conductive portions 30 of the first sheet 21 are formed to have weaker elasticity to be softer than the conductive portions 50 of the second sheet 22. This is realized by changing the elasticity of the polymeric substance of the conductive portions 30 or the density of the conductive particles A in the polymeric substance. This allows the conductive portions 30 to sufficiently contract to ensure a large deformation amount of the conductive portions 30 even when a relatively small load is applied on the first sheet 21.

The mounting table 3 is configured to be movable, for example, laterally and vertically to be able to move the wafer W mounted thereon in three-dimensional directions.

Figure 6:
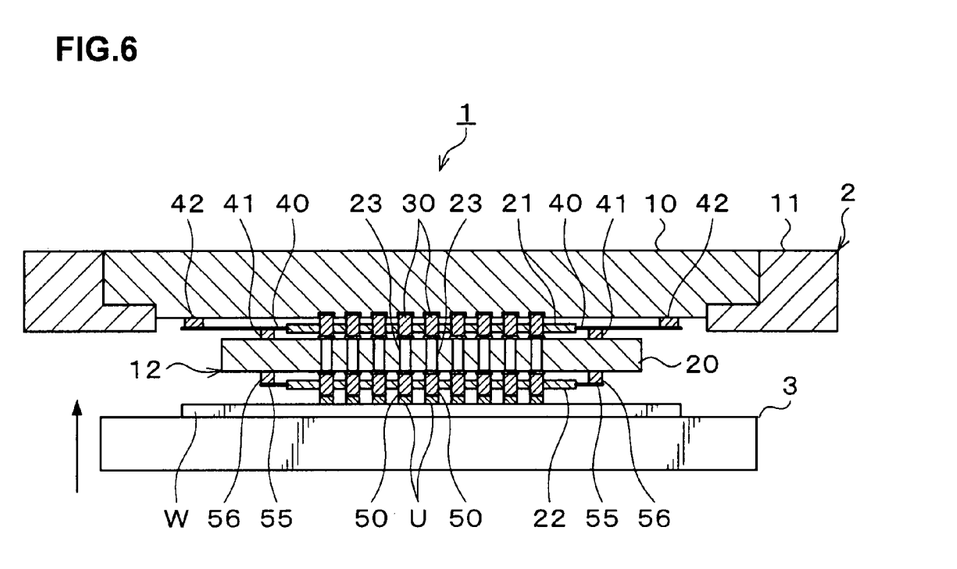
FIG. 6 is an explanatory view of a longitudinal section of the probe device showing a state in which conductive portions are in contact with electrode pads.

Next, the operation of the probe device 1 configured as described above will be described. First, when the wafer W is mounted on the mounting table 3, the wafer W is raised by the mounting table 3 so that the wafer W is pressed against the inspection contact structure 12 from below as shown in FIG. 6. In this event, the electrode pads U on the wafer surface are pressed against and brought into contact with the corresponding conductive portions 50 of the second sheet 22. This press compresses the conductive portions 50 of the second sheet 22 and the conductive portions 30 of the first sheet 21 in the vertical direction into the state capable of making electrical continuity. An electrical signal for inspection is then sent from the circuit board 10 to the electrode pads U through the conductive portions 30 of the first sheet 21, the current-carrying paths 23 of the silicon substrate 20, and the conductive portions 50 of the second sheet 22 in the inspection contact structure 12 in order, to inspect electric properties of a circuit on the wafer W.

According to the above embodiment, the first sheet 21 and the second sheet 22 are respectively placed on the upper and lower surfaces of the silicon substrate 20, and the conductive portions 50 of the second sheet 22 on the lower surface side are brought into contact with the electrode pads U on the wafer W in the probe card 2, so that fine contact portions of 100 μm or less at a pitch of 180 μm or less can be realized. Such fine contact portions at a narrow pitch are realized, as well as the conductive portions 50 of the second sheet 22 can absorb variations in height of the electrode pads U on the wafer W through use of their elasticity. Further, the conductive portions 30 of the first sheet 21 on the upper surface side of the silicon substrate 20 can absorb distortion and inclination of the circuit board 10 through use of their elasticity. Since the first sheet 21 is fixed to the circuit board 10 in particular, the conductive portions 30 can faithfully follow the shape of the circuit board 10 to sufficiently and surely absorb the distortion of the circuit board 10. This resultingly ensures stable electrical contact between the plurality of electrode pads U within the wafer surface and the circuit board 10 so that the inspection of the electric properties of the wafer W can be appropriately and stably performed.

When the inspection contact structure 12 is pressed by the wafer W from below, the conductive portions 50 of the second sheet 22 and the conductive portions 30 of the first sheet 21 are pressurized and compressed. In this event, the conductive portions 50 are directly pressed by the wafer W and thus pressed by a relatively great force. The conductive portions 30 are pressed via the second sheet 22 and the silicon substrate 20 and thus pressed by a relatively small force. Under such a condition, in this embodiment, the conductive portions 30 of the first sheet 21 on the upper side are formed to have weaker elasticity to be softer than the conductive portions 50 of the second sheet 22 on the lower side, so that the conductive portions 30 on the upper side also sufficiently contract when they are pressed by the wafer W from below. As a result, the conductive portions 30 on the upper side and the conductive portions 50 on the lower side contract in a balanced manner to ensure a sufficient contraction distance by the second sheet 22 and the first sheet 21 in cooperation. Therefore, the second sheet 22 can sufficiently absorb variations in height of the electrode pads U as well as the first sheet 21 can sufficiently absorb distortion and inclination of the circuit board 10. Further, the conductive portions 30 of the first sheet 21 are sufficiently pressed down, thereby ensuring the electrical continuity of the conductive portions 30 themselves to improve the reliability of the inspection of the electric properties.

In the above embodiment, the first sheet 21 is fixed to the circuit board 10 by the metal frame 40, outside the silicon substrate 20, so that when the inspection contact structure 12 is pressed by the wafer W from below, the inspection contact structure 12 vertically moves with the fixed end outside the silicon substrate 20 as a supporting point. In this case, unlike the case in which the fixed point is located on the silicon substrate 20, there is no possibility of distortion of the silicon substrate 20 and the first sheet 21 and the second sheet 22 which are attached to the silicon substrate 20, and the first sheet 21, the silicon substrate 20, and the second sheet 22 which are located at the middle of the inspection contact structure 12 can vertically move in parallel while keeping their horizontal states. This results in stable electrical connection between the plurality of electrode pads U within the wafer and the inspection contact structure 12 and between the inspection contact structure 12 and the circuit board 10. Further, the fixed end of the inspection contact structure 12 apart outward from the central portion increases the flexibility and plasticity to cope with, for example, a large distortion and projections and depressions of the circuit board 10 and the wafer W as well.

Further, the metal frame 40 is provided with the plurality of plate shape portions 40*b*, and the outer end portions of the plate shape portions 40*b* are fixed to the circuit board 10, so that the metal frame 40 increases in flexibility to further improve the plasticity of the inspection contact structure 12, thus more flexibly coping with the distortion and projections and depressions of the circuit board 10 and the wafer W.

Since the metal frame 40 is bonded to the circuit board 10 with the elastic adhesive 42, the adhesion between the metal frame 40 and the circuit board 10 can be maintained even when the circuit board 10 is thermally expands and contracts in the horizontal direction.

The metal frame 40 and the metal frame 55 are made of a material having the same thermal expansion coefficient as that of the wafer W, so that if the wafer W thermally expands and contracts in the horizontal direction, the metal frames 40 and 55 thermally expand and contract in a similar manner. Therefore, the first sheet 21 and the second sheet 22 holed on the metal frames 40 and 55 similarly expand and contract to prevent positional displacement between the conductive portions 30 and 50 and the electrode pads U.

The silicon substrate 20 is also made of a material having the same thermal expansion coefficient as that of the wafer W to prevent positional displacement between carrying paths 23 of the silicon substrate 20 and the electrode pads U or the conductive portions 30 or 50. Further, because of the silicon substrate 20, it can be microfabricated with a high positional accuracy by the photolithography technique and the etching technique, and can be formed with the current-carrying paths 23 which are fine at a narrow pitch. In addition, in the case of the silicon substrate 20, a strength can be ensured to fix the first sheet 21 and the second sheet 22 without distortion.

The first sheet 21 and the second sheet 22 are bonded to the silicon substrate 20 with the elastic adhesives 41 and 56 so that the adhesion between the silicon substrate 20 and the sheets 21 and 22 can be maintained even when the silicon substrate 20, for example, thermally expands and contracts in the horizontal direction.

The conductive portions 30 of first sheet 21, the conductive portions 50 of the second sheet 22, and the current-carrying paths 23 of the silicon substrate 20 are arranged on the same axes in the vertical direction, so that when the conductive portions 50 of the second sheet 22 are pressed by the electrode pads U on the wafer W from below, only opposed stresses on the same axis acts from above and below but no bending moment acts on the silicon substrate 20, resulting in prevention of distortion and breakage of the silicon substrate 20.

According to the above embodiment, the conductive portions 30 of the first sheet 21 are fixed to the silicon substrate 20 and the circuit board 10 and the conductive portions 50 of the second sheet 22 are fixed to the silicon substrate 20, in the state incapable of making electrical continuity without being compressed, so that they can be brought into electrical continuity only after they are pressed by the wafer W into compression. Therefore, unlike the case where the conductive portions 30 and 50 are fixed, in the compressed state, to the silicon substrate 20 and the circuit board 10, no contact failure occurs in any of the plurality of conductive portions 30 and 50, resulting in stable contact between the conductive portions 30 and 50 and the silicon substrate 20 and the circuit board 10 during inspection. As a result, the inspection of the electric properties of the wafer W can be stably performed.

Figure 7:
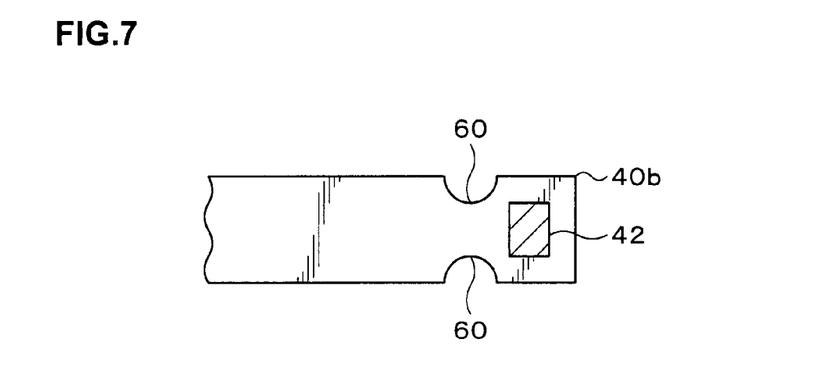
FIG. 7 is a plan view of a plate shape portion of a metal frame formed with notches.

The plate shape portion 40b of the metal frame 40 described in the above embodiment may be formed with notches 60 on side surfaces in the width direction of the plate shape portion 40b as shown in FIG. 7. The notch portions 60 are formed inside the position of the adhesive 42 applied at the end portion of the plate shape portion 40b (on the side of the frame shape portion 40a and the first sheet 21). The notches 60 are formed on both side surfaces of the plate shape portion 40b to be opposed each other. In this case, the plate shape portion 40b has a thinned portion to make the metal frame 40 easy to bend, resulting in further improvement in flexibility of the inspection contact structure 12 to cope with the distortion and projections and depressions of the circuit board 10 and the wafer W with more ease.

Figure 8:
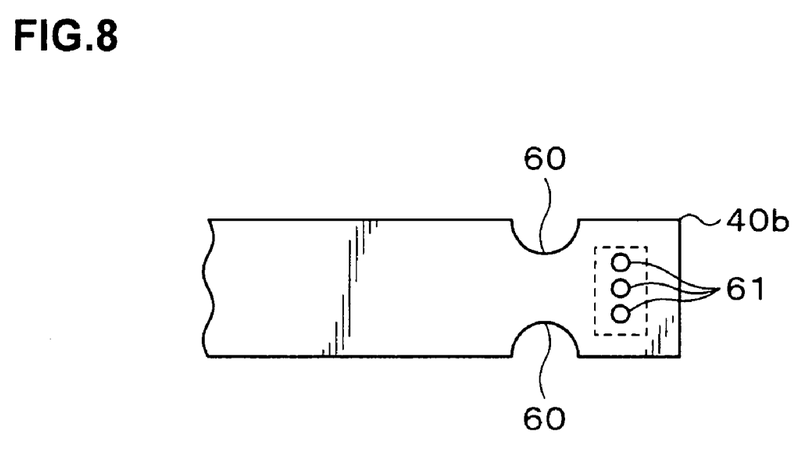
FIG. 8 is a plan view of a plate shape portion of a metal frame formed with through holes.
Figure 9:
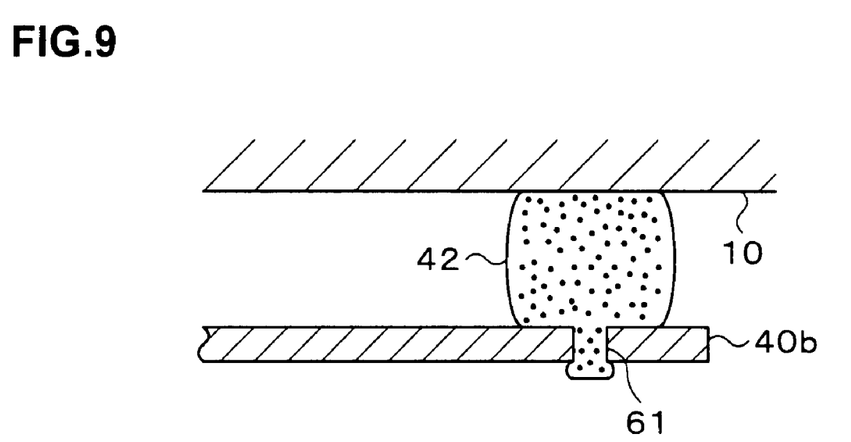
FIG. 9 is an enlarged longitudinal sectional view of a bonded portion of the plate shape portion formed with the through holes and a circuit board.

Further, a plurality of through holes 61 in the thickness direction may be formed at the end portion of the plate shape portion 40b as shown in FIG. 8 and FIG. 9, so that a portion of the adhesive 42 is filled in the through holes 61. In this case, the contact area between the adhesive 42 and the plate shape portion 40b can be increased to improve the adhesion strength between the plate shape portion 40b and the circuit board 10. Accordingly, even if the inspection contact structure 12 is bonded to the circuit board 10 outside the silicon substrate 20 and a great load is applied to that bonded portion, the inspection contact structure 12 never falls off because of breakage of the bonded portion.

Figure 10:
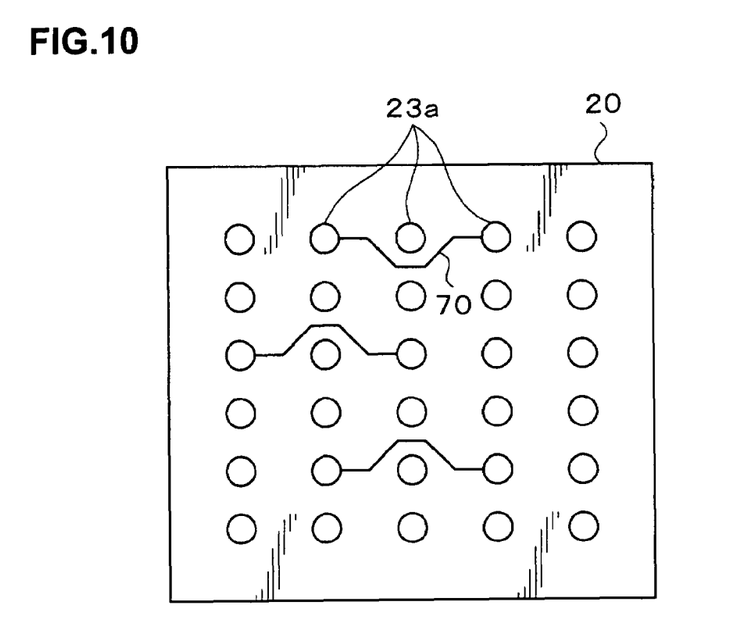
FIG. 10 is a plan view of a silicon substrate where a wiring pattern is formed on its upper surface.
Figure 11:
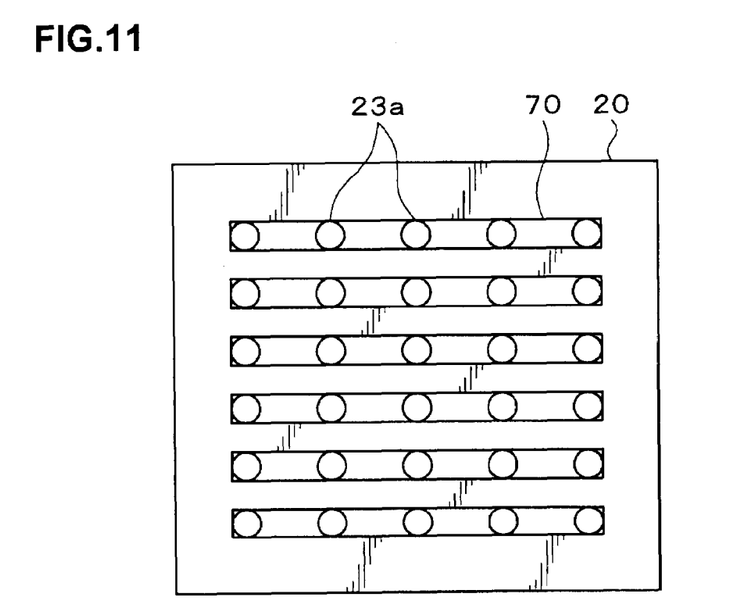
FIG. 11 is a plan view of a silicon substrate where another wiring pattern is formed on its upper surface.

A predetermined wiring pattern in which predetermined connecting terminals are connected by metal wires may be formed, for example, by the photolithography technology on at least any of the upper surface and the lower surface of the silicon substrate 20 in the above embodiment. For example, particular upper connecting terminals 23a may be connected with each other using metal wires 70 on the upper surface of the silicon substrate 20 as shown in FIG. 10, or the upper connecting terminals 23a on straight lines in a predetermined direction may be connected with each other using metal wires 70 to form parallel connection lines as shown in FIG. 11. In this case, the plurality of conductive portions 30 corresponding to the mutually connected upper connecting terminals 23a can be used for inspection of, for example, the same electrode pads U depending on the pattern of the electronic circuit on the wafer W. In this case, since inspection of one electrode pad U is performed using the plurality of conductive portions 30, the inspection is performed with more reliability. Further, the connecting wiring pattern of the upper connecting terminals 23a on the silicon substrate 20 can be created depending on the pattern of the electronic circuit, thus making it possible to form the wiring pattern more relatively easily than change of the wiring pattern within the circuit board 10 and to appropriately cope with every pattern of the electronic circuit. Note that a wiring pattern may be formed in which particular lower connecting terminals 23b are connected with each other on the lower surface of the silicon substrate 20.

Figure 12:
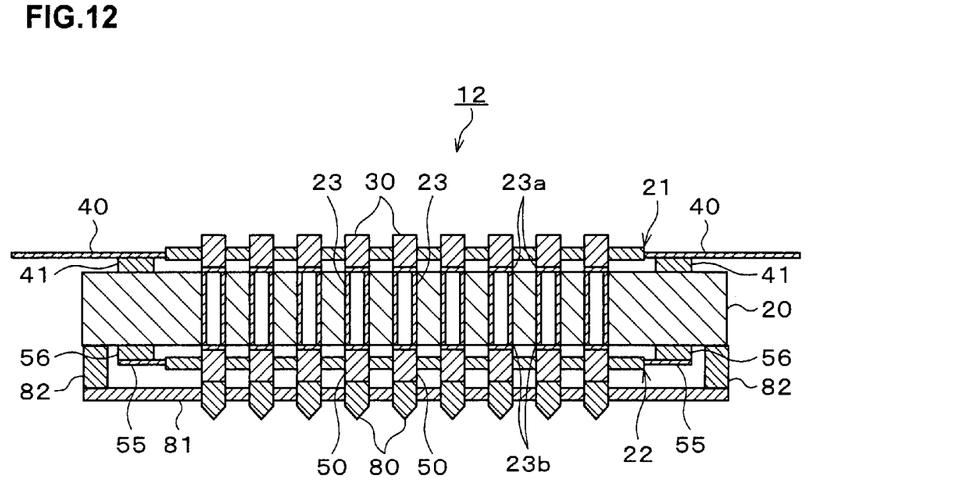
FIG. 12 is an explanatory view of a longitudinal section of an inspection contact structure having tapered contactors attached thereto.

Contactors for contact with the electrode pads U on the wafer W may be attached to tip portions of the conductive portions 50 of the second sheet 22 described in the above embodiment. In this case, for example, a plurality of contactors 80 in a tapered shape having a sharp tip are arranged to correspond to the conductive portions 50 as shown in FIG. 12 and held by a holder 81. The contactors 80 are made of, for example, a conductive metal. The holder 81 is formed in a flat plate shape and made of an insulating material. The outer peripheral portion of the holder 81 is supported on the lower surface of the silicon substrate 20 by a supporting member 82, and top end surfaces of the contactors 80 abut the bottom surfaces of the conductive portions 50 in an unpressurised state. To inspect electric properties of the circuit on the wafer W, the electrode pads U on the wafer W are pressed against the tip portions of the contactors 80 so that the electrical signal from the circuit board 10 is supplied to the electrode pads U via the contactors 80. In this case, the contact pressure between the contactors 80 and the electrode pads U is large enough to ensure higher stability of the contact. Further, since the conductive portions 50 are not in direct contact with the electrode pads U, wear and breakage of the conductive portions 50 can be prevented.

The preferred embodiments of the present invention has been described above with reference to the accompanying drawings, but the present invention is not limited to the embodiment. It should be understood that various changes and modifications will be readily apparent to those skilled in the art within the scope of the spirit as set forth in claims, and those should also be covered by the technical scope of the present invention. For example, the fixation between the first sheet 21 and the circuit board 10 is made by the adhesive 42 in the above embodiment, but not limited to that and may be performed by a fixing member such as a bolt. Further, while the adhesive 41 fixing the first sheet 21 and the silicon substrate 20 and the adhesive 56 fixing the second sheet 22 and the silicon substrate 20 are vertically opposed each other with the silicon substrate intervening therebetween in terms of position in the above embodiment, they may be arranged at positions different from each other. Further, any shape, number, and arrangement can be appropriately selected for the conductive portions 30 and 50 of the first sheet 21 and the second sheet 22 described in the above-described embodiment. For example, the shape of the conductive portions 30 and 50 is not limited to the square pole but may be a circular cylinder. Further, the shape, number, and arrangement of the current-carrying paths 23 of the silicon substrate 20 are not limited to those of the above-described embodiment but can also be appropriately selected. Further, the number of the conductive portions 30, the conductive portions 50, and the current-carrying paths 23 may be not corresponding. Further, the substrate constituting the inspection contact structure 12 is not limited to the silicon substrate but can be, for example, an organic substrate, a silicon dioxide substrate, a glass substrate, and the like which can be subjected to etching process. Further, the present invention is also applicable to a case where the object to be inspected is a substrate other than the wafer W, such as an FPD (Flat Panel Display) or the like.

What is claimed is:

1. A probe card for inspecting electric properties of an object to be inspected located thereunder, comprising:
   a circuit board; and
   an inspection contact structure provided between said circuit board and the object to be inspected, for passing current between the object to be inspected and said circuit board,
   said inspection contact structure comprising:
   a substrate in a flat plate shape; and
   sheets attached to both upper and lower surfaces of said substrate to have the substrate sandwiched therebetween, each of said sheets composed of a plurality of elastic conductive portions and an insulating portion interconnecting said conductive portions,
   said conductive portions being formed to pass through each of said sheets and protrude from both upper and lower surfaces of each of said sheets, said substrate being formed with a plurality of current-carrying paths passing from the upper surface to the lower surface of said substrate, said conductive portions of said sheets on both surfaces of said substrate being electrically connected to corresponding current-carrying paths of said substrate, said sheets on both surfaces of said substrate being bonded to said substrate, said sheet on the upper surface side of said substrate having a frame attached thereto, and said frame surrounding an outer peripheral portion of said sheet on the upper surface side and holding said sheet on the upper surface side, and said sheet on the upper surface side being bonded to said circuit board by said frame; and wherein said frame is fixed to said circuit board at a position outside an outer periphery of said substrate.

2. A probe card for inspecting electric properties of an object to be inspected located thereunder, comprising:

a circuit board; and an inspection contact structure provided between said circuit board and the object to be inspected, for passing current between the object to be inspected and said circuit board, said inspection contact structure comprising:

a substrate in a flat plate shape; and a sheet attached to an upper surface of said substrate, said sheet composed of a plurality of elastic conductive portions and an insulating portion interconnecting said conductive portions, said conductive portions being formed to pass through said sheet and protrude from both upper and lower surfaces of said sheet, said substrate being formed with a plurality of current-carrying paths passing from the upper surface of said substrate to a lower surface of said substrate, said conductive portions of said sheet being electrically connected to corresponding current-carrying paths of said substrate, said sheet being bonded to said substrate, and said sheet having a frame attached thereto, said frame surrounding an outer peripheral portion of said sheet and holding said sheet, and said sheet being bonded to said circuit board by said frame; and wherein said frame is fixed to said circuit board at a position outside an outer periphery of said substrate.

3. The probe card as set forth in claim 2, wherein said inspection contact structure further comprises:

a sheet bonded to the lower surface of said substrate sandwiching said substrate between the sheet bonded to the lower surface of said substrate and said sheet bonded to the upper surface of said substrate, said sheet bonded to the lower surface side being composed of a plurality of elastic conductive portions and an insulating portion interconnecting said conductive portions, said conductive portions being formed to pass through said sheet bonded to the lower surface of said substrate and protrude from both upper and lower surfaces of said sheet bonded to the lower surface of said substrate, and said conductive portions of said sheet bonded to the lower surface of said substrate being electrically connected to corresponding current-carrying paths of said substrate.

4. The probe card as set forth in claim 3, wherein said current-carrying paths pass through said substrate in a vertical thickness direction, and wherein said conductive portions of said sheets on both surfaces of said substrate are in contact with end portions of said respective corresponding current-carrying paths of said substrate in a manner to have said current-carrying paths of said substrate sandwiched therebetween.

5. The probe card as set forth in claim 3, wherein said conductive portions of said sheet on the upper surface side of said substrate are formed to have weaker elasticity than that of said conductive portions of said sheet on the lower surface side of said substrate.

6. The probe card as set forth in claim 2, wherein said frame has a plurality of flexible plate shape members extending to the outside of said substrate, and wherein outer end portions of said plate shape members are fixed to said circuit board.

7. The probe card as set forth in claim 4, wherein a notch is formed in a side surface in a width direction perpendicular to an outward direction of said plate shape member.

8. The probe card as set forth in claim 4, wherein a hole is formed at an outer end portion of said plate shape member, and said frame is fixed to said circuit board with an adhesive partially entering the hole.

9. The probe card as set forth in claim 2, wherein said frame is fixed to said circuit board with an elastic adhesive.

10. The probe card as set forth in claim 2, wherein said frame is made of a material having a same thermal expansion coefficient as that of the object to be inspected.

11. The probe card as set forth in claim 3, wherein said frame is a first frame, said sheet on the lower surface side of the substrate having a second frame attached thereto, said second frame surrounding an outer peripheral portion of said sheet on the lower surface side and holding said sheet on the lower surface side, and said sheet on the lower surface side being fixed to said substrate by said second frame.

12. The probe card as set forth in claim 3, wherein said second frame is fixed to said substrate with an elastic adhesive.

13. The probe card as set forth in claim 3, wherein said second frame is made of a material having a same thermal expansion coefficient as that of the object to be inspected.

14. The probe card as set forth in claim 2, wherein said substrate is made of a material having a same thermal expansion coefficient as that of the object to be inspected.

15. The probe card as set forth in claim 12, wherein said substrate is a silicon substrate.

16. The probe card as set forth in claim 2, wherein said conductive portions of said sheets on both the upper surface and the lower surface of said substrate and said current-carrying paths of said substrate are arranged on same axes in a vertical direction.

17. The probe card as set forth in claim 2, wherein a metal wiring connecting predetermined current-carrying paths is formed on at least one of the upper surface and the lower surface of said substrate.

18. The probe card as set forth in claim 3,
wherein tapered contactors that come into contact with the object to be inspected are attached to tip portions of said conductive portions of said sheet on the lower surface side of said substrate, and
wherein said contactors are held on a holder and fixed to said substrate by said holder.

19. The probe card as set forth in claim 3,
wherein said conductive portions of said sheets are brought into a state capable of making electrical continuity when compressed in the vertical direction, and
wherein said sheet on the upper surface side is fixed to said substrate and said circuit board and said sheet on the lower surface side is fixed to said substrate with said conductive portions being in a state incapable of making electrical continuity without being compressed.

20. A probe card for inspecting electric properties of an object to be inspected located thereunder, comprising:
a circuit board; and
an inspection contact structure provided between said circuit board and the object to be inspected, for passing current between the object to be inspected and said circuit board,
said inspection contact structure comprising:
a substrate in a flat plate shape; and
sheets attached to both upper and lower surfaces of said substrate to have the substrate sandwiched therebetween, each of said sheets composed of a plurality of elastic conductive portions and an insulating portion interconnecting said conductive portions,
said conductive portions being formed to pass through each of said sheets and protrude from both upper and lower surfaces of each of said sheets,
said substrate being formed with a plurality of current-carrying paths passing from the upper surface of said substrate to the lower surface of said substrate,
said conductive portions of said sheets on both surfaces of said substrate being electrically connected to corresponding current-carrying paths of said substrate,
said sheets on both surfaces of said substrate being fixed to said substrate, and
said sheet on the upper surface side of said substrate having a frame attached thereto,
said frame surrounding an outer peripheral portion of said sheet and holding said sheet, and said sheet on the upper surface side being fixed to said circuit board by said frame; and
wherein said frame is fixed to said circuit board at a position outside an outer periphery of said substrate,
wherein said frame has a plurality of flexible plate shape members extending to the outside of said substrate, and
wherein outer end portions of said plate shape members are fixed to said circuit board.

* * * * *